United States Patent
Li et al.

(10) Patent No.: US 8,034,411 B2
(45) Date of Patent: Oct. 11, 2011

(54) METHOD OF PREVENTING ABNORMAL LARGE GRAINS FROM BEING INCLUDED INTO THIN NANO-CRYSTALLINE DIAMOND FILM

(75) Inventors: Heqing Li, Seoul (KR); Wook Seong Lee, Seoul (KR); Young Joon Baik, Seoul (KR); Jong-Keuk Park, Seoul (KR)

(73) Assignee: Korea Institute of Science and Technology (KR)

( * ) Notice: Subject to any disclaimer, the term of this patent is extended or adjusted under 35 U.S.C. 154(b) by 1012 days.

(21) Appl. No.: 11/931,963

(22) Filed: Oct. 31, 2007

(65) Prior Publication Data

US 2009/0074986 A1 Mar. 19, 2009

(30) Foreign Application Priority Data

Sep. 14, 2007 (KR) .................. 10-2007-0093541

(51) Int. Cl.
*C23C 16/00* (2006.01)
*C23C 16/26* (2006.01)
*C23C 16/52* (2006.01)

(52) U.S. Cl. ............... 427/249.8; 427/249.1; 427/248.1; 427/8

(58) Field of Classification Search ............... 427/249.1, 427/248.1, 249.8, 8
See application file for complete search history.

(56) References Cited

U.S. PATENT DOCUMENTS

| | | | |
|---|---|---|---|
| 2002/0011211 A1* | 1/2002 | Halpin | 118/715 |
| 2006/0219158 A1* | 10/2006 | Breidt et al. | 117/68 |
| 2008/0063888 A1* | 3/2008 | Sumant et al. | 428/599 |

OTHER PUBLICATIONS

Bieberich et al. Control of Substrate Temperature During Diamond Deposition, 1996, Plasma Chemistry and Plasma Processing, vol. 16, No. 1 pp. 157S-168S.*

* cited by examiner

*Primary Examiner* — Kelly M Gambetta
(74) *Attorney, Agent, or Firm* — Baker & Hostetler LLP

(57) ABSTRACT

The present invention relates to a method of preventing abnormal large grains from being included in a NCD thin film during a hot filament CVD process by appropriately controlling the deposition condition regarding a temperature-measuring means, a deposition pressure, an electrical potential and/or the composition of a raw material gas flow.

8 Claims, 10 Drawing Sheets

A

B a) 100 Torr, no bias, 3%CH4+0.3%N2     b)100 Torr, bias, 3%CH4+0.3%N2

METHOD OF PREVENTING ABNORMAL LARGE GRAINS FROM BEING INCLUDED INTO THIN NANO-CRYSTALLINE DIAMOND FILM

FIELD OF THE INVENTION

The present invention relates to a method of preventing abnormal large grains from being included into a thin nano-crystalline diamond (NCD) film during a hot filament chemical vapor deposition (CVD) process.

BACKGROUND OF THE INVENTION

A thin NCD film, which has grain sizes of nm dimensions, represents a low surface roughness, low deposition temperature, low residual stress, and equiaxed grain structure, as compared to a columnar structure of a thin microcrystalline diamond (MCD) film having grain sizes of micron level. Accordingly, the NCD film has been applied to a wide variety of fields.

A microwave plasma-assisted CVD and a hot filament CVD have been most widely employed in depositing the NCD film. The microwave plasma-assisted CVD produces less contamination during process, and high decomposition efficiency due to the use of plasma, but has disadvantages of requiring an expensive equipment. Whereas, the hot filament CVD has advantages in that it is cost-effective and readily employable to mass production and to make large area films.

One of the most important interests in depositing the NCD film is to reduce the size of grains to a level of nm and also uniformly implement a microstructure thereof. This microstructure characteristic may include the size and distribution of grains, the surface roughness, the existence of pinholes or voids, and so on. Of them, the size and distribution of grains is the most important parameters. For example, there is a possibility that large grains having several hundreds nm or μm or more in size may be included in a NCD film comprised of grains having a size of a level of 20 to 50 nm. This inclusion of these abnormal large grains is a known phenomenon in microstructure of ceramic sintered body and hard carbonaceous sintered body, and there has been made many efforts to prevent such phenomenon because it causes to degrade fracture strength (see [Cha et al. *Material Science and Engineering A*, 356:381-389, 2003] and [Cho et al., *J. Am. Ceram. Soc.*, 87(3):443-448, 2004]).

For example, in documents [Wei Liu, et al., *Thin Solid Films*, 467:4-9, 2004], Shr-Ming Huang, et al., *Surface and Coatings Technology*, 200:3160-3165, 2006] and X. T. Zhou, et al., *Applied Physics Letters*, 80:3307-3309, 2002], a method of reducing the size of grains by continuously applying a negative bias to a substrate during a deposition process has been attempted. However, this method gives damage to the surface of the diamond thin film due to the collision of ions having a large mass, and has disadvantages in that the content of non-diamond phase on the surface of the diamond thin film increases and residual stress significantly increases.

Further, in a document [Wu Nan-Chun, et al., *Chin. phys. lett.*, 22(11):2969-2972, 2005], a method of applying a positive bias to a substrate while lowering a gas pressure to 7 torr or less in an electron-associated (EA) CVD process were used in order to make finer size of grains to a size of a nm level. This document discloses that since the fine grains are generated by the collision of electrons caused by the positive bias, a mean free path of the electrons increases by lowering the gas pressure, thereby increasing the acceleration of electrons and thus, resulting in finer grains. However, in this document, a carbon source (e.g., $CH_3COCH_3$) including oxygen was used, and the range of a gas pressure used was very low. This document also reported that a gas pressure of 15 torr generates MCD, whereas lowering of the pressure to 7.5 torr and 0.75 torr stepwise can reduce grain sizes.

As described above, although many efforts have been made to prevent the inclusion of abnormal large grains occurring in the microstructure of a NCD film deposited by a hot filament CVD process, there is still a need for the improvement of this technique.

SUMMARY OF THE INVENTION

It is, therefore, an object of the present invention to provide a method of preventing abnormal large grains from being included into a thin nano-crystalline diamond film deposited on a substrate by a hot filament CVD process using a gas mixture of a hydrogen, hydrocarbon and nitrogen as a raw material gas.

In accordance with one embodiment of the present invention, there is provided a method of preventing abnormal large grains from being included into a thin nano-crystalline diamond (NCD) film which is deposited on a substrate by a hot filament chemical vapor deposition (CVD) process using a gas mixture of a hydrocarbon, nitrogen and hydrogen, which comprises:

providing a thermally conductive, inert and elongated material to contact one end thereof to the substrate, and to contact the other end thereof to a thermocouple provided in the CVD process to measure a temperature of the substrate, the distance between the ends being greater than or equal to 50 millimeters;

providing a thermocouple protectively coated with a thermally conductive and inert material in the CVD process;

measuring a temperature of the substrate in a non-contact manner, without using a tactile thermocouple;

or a combination thereof.

In accordance with a further embodiment of the present invention, there is provided a method of preventing abnormal large grains from being included into a thin nano-crystalline diamond (NCD) film on a substrate by a hot filament chemical vapor deposition (CVD) process using a gas mixture of a hydrocarbon, nitrogen and hydrogen, which comprises:

maintaining a gas pressure in a chamber for the CVD process at 10 torr or higher;

controlling the hydrocarbon and nitrogen contents of the gas mixture to 0.1 to 8% by volume and 10% by volume or less, respectively;

applying a positive bias voltage to the substrate;

or a combination thereof.

BRIEF DESCRIPTION OF DRAWINGS

The above and other objects and features of the present invention will become apparent from the following description of preferred embodiments given in conjunction with the accompanying drawings, in which:

FIGS. 3a and 4a show the results measured where the NCD thin film is deposited at a 3% methane-0.3% nitrogen-96.7% hydrogen composition with applying no bias to a substrate, FIGS. 3b and 4b, at a 3% methane-0.3% nitrogen-96.7% hydrogen composition with applying a bias to a substrate, FIGS. 3c and 4c, at a 5% methane-0.5% nitrogen-94.5% hydrogen composition with applying no bias to a substrate, and FIGS. 3d and 4d, at a 5% methane-0.5% nitrogen-94.5% hydrogen composition with applying a bias to a substrate;

FIGS. 5a, 6a and 7a show the results measured where a substrate bias is not used, and FIGS. 5b, 6b and 7b show those measured where a substrate bias is used;

DETAILED DESCRIPTION OF THE EMBODIMENTS

The present invention provides a method of preventing the inclusion of abnormal large grains into a thin nano-crystalline diamond film during a hot filament CVD process using a gas mixture of a hydrocarbon, nitrogen and hydrogen.

The present invention is characterized in that the deposition conditions regarding a temperature-measuring means, a deposition pressure, an electrical potential and/or the composition of a raw material gas flow are controlled.

In the present invention, a NCD thin film is fabricated using a hot filament CVD process, wherein a gas mixture of a hydrocarbon, nitrogen and hydrogen is used as a raw material gas. The hydrocarbon is preferably selected from the group consisting of methane, ethane and propane, and a mixture thereof. The hydrocarbon content of the raw material gas may be in the range of 0.1 to 8 volume %, preferably, 3 to 6 volume %. When the hydrocarbon is methane, it is preferably used in an amount of 1 to 8 volume %. The other hydrocarbon than methane may be used in an amount corresponding to that contains the carbon content of 1 to 8 volume % of methane. The nitrogen content of the raw material gas may be in the range of up to 10 volume %.

The hydrocarbon content may be adequately controlled according to the gas pressure of the chamber. A gas pressure in a chamber for conducting the CVD process may be 10 torr or higher, preferably 30 torr to 100 torr. For example, when a gas pressure is in the range of 30 to 100 torr, the hydrocarbon content may be set to 3 to 5 volume %, with an optional application of a positive bias, whereas when a gas pressure in the chamber is more low, e.g., 10 to 15 torr, it is preferred that positive bias may be applied to the substrate with an optional increasing of the hydrocarbon content. At this time, the positive bias may be applied to the substrate, e.g., in the range of 20 to 150 V, if applied.

The inclusion of the abnormal large grains may be also influenced by a thermocouple metal line used to measure a deposition temperature, a ceramic insulating tube for electrically insulating the thermocouple metal line and so on.

Figure 1:
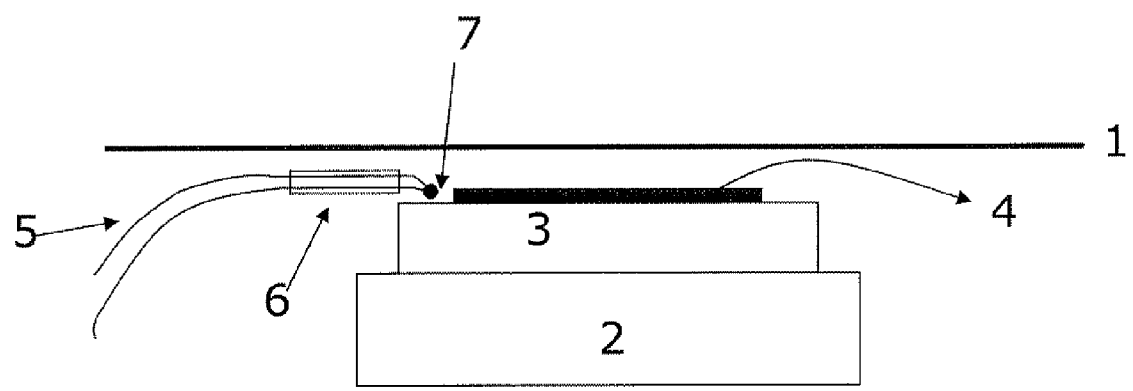
FIG. 1 is a schematic view of a deposition region part of a hot filament CVD apparatus.

As shown in FIG. 1, in a general hot filament CVD process, filament 1, several tungsten lead wires disposed horizontally within a distance of about 5 mm over substrate 4, is electrically heated to a temperature of about 2,400 degrees Celsius or higher, the substrate 4 being mounted on substrate holder 3 made of a high-melting point metal, and mounted on cooling block 2. The temperature of the substrate 4 may be generally controlled by adjusting the degree of thermal contact between the substrate holder 3 and the cooling block 2 after measuring the temperatures of the substrate 4 itself and the substrate holder 3, or adjusting the temperature of the filament 1, or using an additional heating means. In measuring the temperature of the substrate 4 or the substrate holder 3, thermocouple 5 is most usually used.

The thermocouple has typically a shape in which one side ends of a pair of thin metal lead wires 5 are welded together to form welded end 7, which is to be brought in contact with a target, to measure the temperature of the target, and the remaining portions other than the welded end portion are generally electrically insulated by ceramic protection tube 6, etc. The ceramic protection tube 6 used for insulating the thermocouple may be is formed by molding and sintering a ceramic powder, such as alumina ($Al_2O_3$) or magnesia (MgO), and it has generally a cylindrical form having a diameter of about 3 mm and filled at the inside thereof, which has perforated a pair of parallel holes having a diameter of 1 mm or less through which the pair of metal lines of the thermocouple 5 can pass in an axial direction. The ceramic protection tube may be formed in a curved shape by employing a series of short ceramic tubes having a length of about 10 mm.

Figure 2:
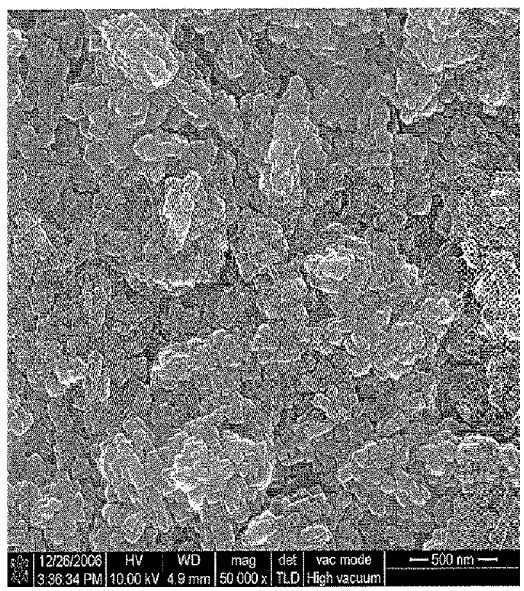
FIG. 2 illustrates microstructures of a NCD thin film, which is deposited on a 4-inch silicon substrate using a thermocouple positioned in a deposition region at a chamber gas pressure of 30 torr, and 3% methane-0.3% nitrogen-96.7% hydrogen composition of gas for 2 hours.
Figure 2:
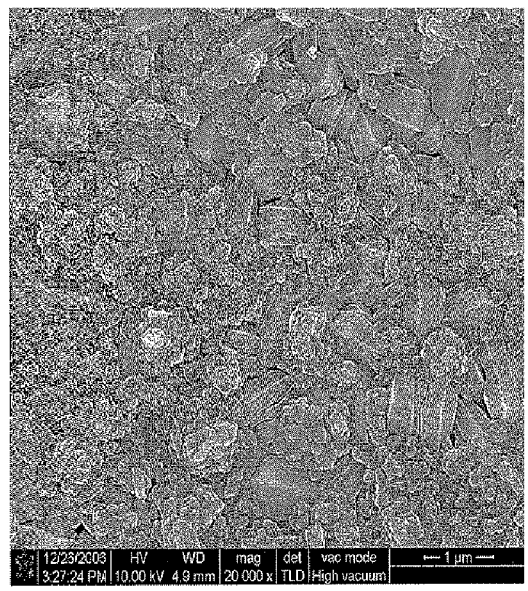
Figure 2C:
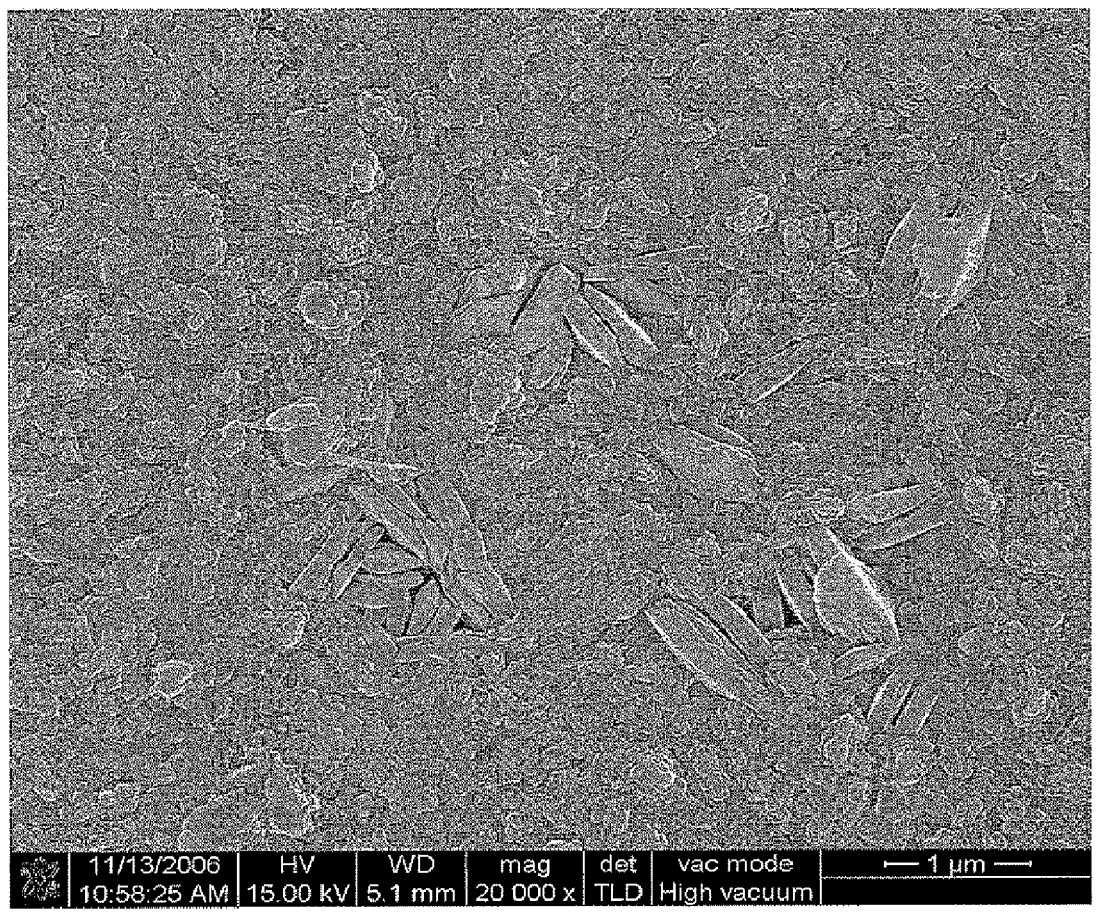
FIG. 2*a* shows the result measured at a part far from the thermocouple (the central part of the 4-inch wafer), FIGS. 2*b* and 2*c*, at parts adjacent to the thermocouple.

In case the thermocouple is provided in the deposition region, e.g., as shown in FIG. 1 (at this time, a silicon wafer having a diameter of 4 inches is used as a substrate and a chamber gas pressure of 10 to 100 torr are used), large grains of 1 μm in size are incorporated into nanocrystalline diamond grains having several tens nm in size are monitored on the left end of the substrate, i.e., at the portion adjacent to the thermocouple (see FIGS. 2b and 2c). However, the large grains as described above are not found at the portion far from the thermocouple, for example, at a central portion or the right end of the substrate (see FIG. 2a).

Figure 5:
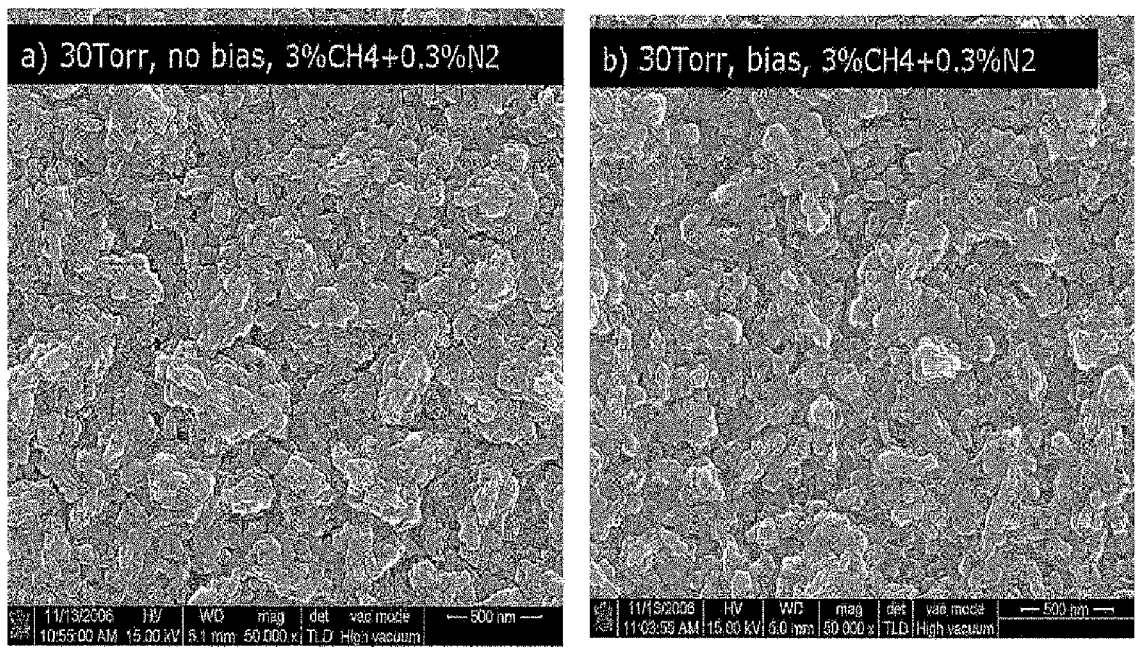
FIGS. 5, 6 and 7 illustrate surface microstructures of a NCD thin film, which is deposited at chamber gas pressures of 30 torr, 50 torr and 100 torr, respectively, in addition to the condition of a 3% methane-0.3% nitrogen-96.7% hydrogen composition.

In contrast, in a NCD thin film deposited without using the thermocouple, any inclusion of large grains are not monitored over the entire substrate even under the exactly same condition as the deposition condition of FIG. 2 (see FIG. 5a). Accordingly, it can be seen that the inclusion of the large grains, as shown in FIG. 2b, occurs as the thermocouple is exposed near the deposition region.

The inclusion of abnormal large grains in a NCD thin film caused by the thermocouple having the ceramic protection tube mounted thereon may be deduced as follows.

In general, the ceramic tube for protecting and insulating the thermocouple is fabricated using ceramic materials such as alumina and magnesia. Although these metals are stable and are not decomposed even though they are exposed to a high temperature for a long time in air or under an oxygen atmosphere, they may be reduced and decomposed into aluminum and oxygen at a high temperature condition of 2,400° C. and under a strong reducible atmosphere caused by thermal decomposition hydrocarbon and hydrogen gases during the hot filament CVD process. Consequently, there is a possibility that metal component generated by the thermal decomposition of the ceramic materials affect on the deposition region to cause such inclusion of abnormal large grains.

Further, in the hot filament CVD process, the filament and the substrate or the substrate holder are generally disposed in a very short vertical distance of about 5 to 8 mm, and the thermocouple enters such a narrow space, with the ceramic insulating tube, to protect the thermocouple, and is thus exposed to radiation heat of the filament, which exceeds 2,400° C. on the upper side. At this time, the substrate is brought in contact with the cooling block through the underlying substrate holder, and is controlled to about 700 to 900° C. Thus, the welded end point of the thermocouple is brought in contact with the surface of the substrate having a controlled temperature and is thus kept to the temperature, whereas the remaining portions of the thermocouple is kept not cooled. Accordingly, there is a high possibility that the ceramic tube to protect the thermocouple may be present in a state heated to a much higher temperature than that of the substrate because the ceramic tube is much closer to the filament rather than the substrate. Due to such a high temperature of the ceramic tube, diffusion of aluminum generated by the decomposition of ceramic components can be accelerated and the portion of the substrate adjacent to the ceramic tube is heated locally and additionally.

Furthermore, as the ceramic tube is gradually reduced and deformed under a strong reducible gas of the diamond deposition atmosphere for a long time, impurities may be produced and influence on the deposition. It can be seen from the comparison of FIGS. 2a and 2b (the area of the analysis region is 2 μm×2 μm). Specifically, about 7% of aluminum (Al) is detected in a region where large grains exist as shown in FIG. 2b, whereas the inclusion of aluminum is not monitored in a region where large grains are not monitored as shown in FIG. 2a.

Therefore, according to the present invention, in order to prevent the inclusion of large grains due to such extrinsic factors, (1) the thermocouple is spatially isolated from the deposition region, (2) an assembly of the thermocouple and the insulating tube are isolated physically and chemically in order for them not to affect on the deposition region physically and chemically, or (3) a non-contact type temperature measuring means, without the thermocouple, is used.

The method (1) above may comprise several processes. One of them is a process of disposing the thermocouple at a portion spaced by 50 mm or more, preferably 100 mm or more, from the substrate so that the existence of the thermocouple does not cause the inclusion of large grains.

Another process is to provide small holes that penetrate the substrate holder and the cooling block, thereby making the thermocouple to be inserted in the holes. In this process, the temperature is measured at one point on the bottom of the substrate, and the thermocouple is thermally isolated from the hot filament.

In this process, in order to measure the temperature of the substrate, a material (for example, a diamond thick film strip), which has a good thermal conductivity and is inert in a deposition environment, is preferably used to connect the thermocouple to the substrate by bring one end of the material into contact with the substrate while bring the other end into contact with the thermocouple. The diamond thick film has a length sufficient to provide the distance between the substrate and the thermocouple of 50 mm or more, preferably 100 mm or more, but it can be kept closely to a temperature of the substrate itself due to a high thermal conductivity, which is 2 to 4 times higher than that of copper.

The method (2) above may include a process of coating a portion of the thermocouple adjacent to the deposition region with a material (for example, a diamond thick film, etc.), which has a sufficiently high thermal conductivity and is inert in a diamond deposition environment.

The method (3) above may comprise the use of an optical temperature measuring system wherein a viewing angle capable of blocking an infrared ray radiated from the hot filament is secured, a structure in which the bottom surface of the substrate can be seen therethrough, e.g., a hole which penetrates the substrate holder and the cooling block of FIG. 1, is formed, and the temperature of bottom surface of the substrate is measured in a non-contact manner using the optical temperature measuring means through the hole.

In addition to the above extrinsic factors, the inclusion of abnormal large grains may be also affected by internal factors, such as deposition parameters. For example, in a microstructure of a NCD thin film, which is deposited on a 4-inch silicon substrate by a hot filament CVD process under a low chamber gas pressure of about 15 torr or 10 torr using a gas composition of 3% methane-0.3% nitrogen-96.7% hydrogen, the inclusion of abnormal large grains of about 700 nm or greater in size is monitored (refer to FIGS. 3a and 4a).

Therefore, according to the present invention, in order to prevent the inclusion of large grains, a method of (1) increasing the chamber gas pressure to a critical value or higher, (2) controlling the hydrocarbon and nitrogen contents of a raw material gas, or (3) applying a positive bias to the substrate (i.e., a method of making the substrate have an electrically positive potential with respect to the filament) may be used in combination thereof.

Figure 6:
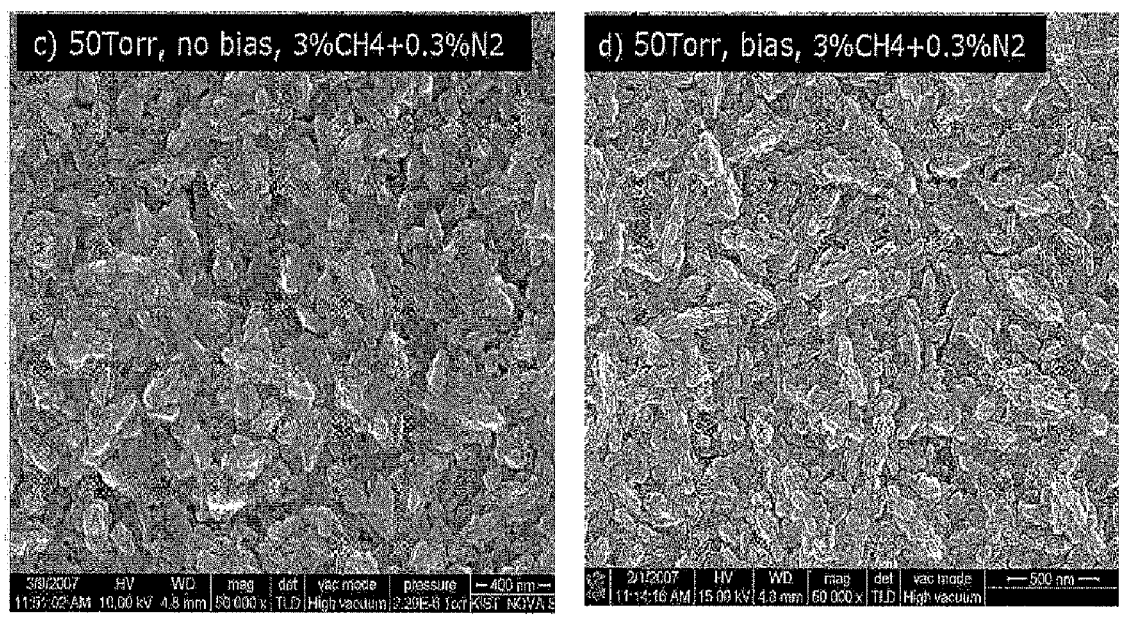
Figure 7:
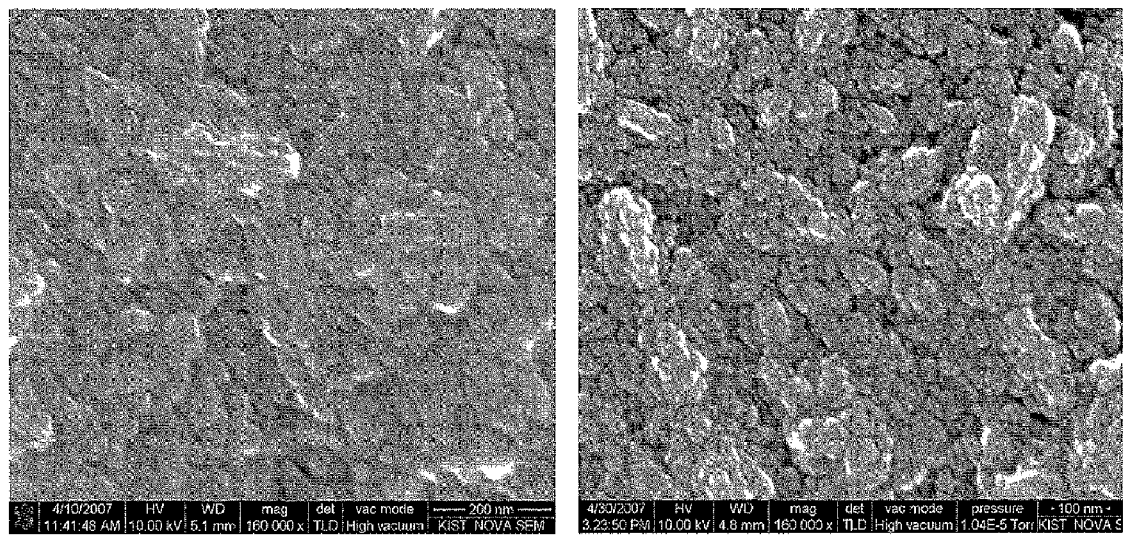

In accordance with the method (1) above, for example, when the chamber gas pressure increases to 15 torr (refer to FIG. 4a), 30 torr (refer to FIG. 5a), 50 torr (refer to FIG. 6a), or 100 torr (refer to FIG. 7a), a NCD thin film having an average grain size of 50 nm or less and including no large grains is formed. If the chamber gas pressure increases as described above, not only the inclusion of abnormal large grains can be prevented, but also the grain sizes of the NCD thin film can be reduced. For example, the grain sizes of the NCD thin film obtained when the chamber gas pressure is 100 torr (refer to FIG. 7) is ⅕ or less than that obtained when the chamber gas pressure is 10 to 50 Torr (refer to FIGS. 3 to 6).

Further, in accordance with the method (2) above, in the event that the hydrocarbon and nitrogen contents of a raw material gas is controlled, for example, when a composition of the raw material gas is 3% methane-0.3% nitrogen-96.7% hydrogen at the chamber gas pressure of 10 torr and 15 torr, abnormal large grains are included in the NCD thin film obtained (refer to FIGS. 3a and 4a). However, when the composition of the raw material gas is 5% methane-0.5% nitrogen-94.5% hydrogen or 4% methane-0.3% nitrogen-95.7% hydrogen, the inclusion of large grains at the chamber gas pressure of 10 torr or 15 torr is completely prevented (refer to FIGS. 3c, 4c and 8). At this time, even when the nitrogen content increases to several times higher than the above content, the microstructure of the NCD thin film is not changed significantly. For example, when the raw material gas of 3% methane-2% nitrogen-95% hydrogen at the chamber gas pressure of 30 Torr is used (refer to FIG. 9), there is no significant difference from the microstructure (refer to FIG. 5a) in which nitrogen of 0.3% is added under the same methane content and the same chamber gas pressure.

Further, in accordance with the method (3) above, when the positive bias is set to 20 to 150 V, not only the inclusion of large grains can be prohibited, but also the substrate has no damage due to that the electrons has a much smaller mass than that of ions and low collision energy accordingly. For example, in a 3% methane-0.3% nitrogen-96.7% hydrogen composition, when a bias is not applied to the substrate at a chamber gas pressure of 10 torr or 15 torr, lots of large grains are included (refer to FIGS. 3a and 4a), whereas when a positive bias is applied to the substrate under the same condition, the development of large grains is significantly prohibited (refer to FIGS. 3b and 4b). Further, the effect of prohibiting abnormal large grains is according to the application of the positive bias to the substrate is not obtained when the chamber gas pressure rises. For example, at the chamber gas pressure of 30 torr or 50 torr, this effect does not appear even if the positive bias is applied to the substrate (refer to FIGS. 5b and 6b). In addition, in a 5% methane-0.5% nitrogen-94.5% hydrogen composition, refinement of grain sizes occurs when the positive bias is applied to the substrate (refer to FIGS. 3c, 3d, 4c, and 4d).

According to the present invention, the shape and existence aspects of abnormal large grains (refer to FIGS. 3a, 3b, 4a, and 4b) caused by the above internal factors are significantly distinguishable from those of abnormal large grains (refers to FIGS. 2b and 2c) caused by the extrinsic factors. In the case of the extrinsic factors, the abnormal large grains and normal nanocrystalline diamond grains surrounding the abnormal large grains are clearly distinct (refer to FIGS. 2b and 2c), whereas in the case of the abnormal large grains caused by the internal factors, such a distinction is unclear (refer to FIGS. 3a, 3b, 4a, and 4b).

Hereinafter, the present invention is described in more detail in conjunction with the following embodiments. However, the following embodiments are only examples of the present invention, but the present invention is not limited thereto.

EXAMPLE 1

In an apparatus as shown in FIG. 1, 4-inch silicon plate as substrate 4 was placed on substrate holder 3, and a raw material gas (3% methane-0.3% nitrogen-96.7% hydrogen) was then injected. At this time, the chamber gas pressure was set to 30 torr and the flow rate of the gas was set to 300 sccm. The deposition was performed for 2 hours while applying an alternating current (AC) to filament 1 to heat filament 1 to a temperature of 2,200° C. to form a NCD thin film on substrate 4. Microstructures of the deposited film of a central portion far from the thermocouple and at a portion adjacent to the thermocouple were monitored using SEM (Nova NanoSEM 200 of FEI Company). The results are shown in FIGS. 2a to 2e.

It was monitored that grains of several tens nm in size were uniformly distributed in the microstructure at the portion far from the thermocouple, of the deposited NCD thin film, as shown in FIG. 2a, whereas large grains of 1 µm in size were incorporated in the NCD film at the portion adjacent to the thermocouple, as shown in FIGS. 2b and 2c.

Accordingly, it can be seen that the inclusion of the large grains, as shown in FIGS. 2b and 2c, is caused as the thermocouple is exposed near the deposition region, and thus, the thermocouple has to be separated from the deposition region in order to prevent the inclusion of the large grains.

EXAMPLES 2 AND 3

NCD thin films were fabricated using the same procedure as in Example 1 except that the chamber gas pressures were lowered to 10 torr and 15 torr, respectively. Microstructures of the deposited thin films were measured using SEM, and the results are shown in FIGS. 3a and 4a, respectively.

EXAMPLES 4 AND 5

NCD thin films were fabricated using the same procedure as in Examples 2 and 3 except that a gas mixture of 5% methane-0.5% nitrogen-94.5% hydrogen was used as the raw material gas. Microstructures of the is deposited thin films were measured using SEM, and the results are shown in FIGS. 3c and 4c, respectively.

EXAMPLES 6 TO 9

NCD thin films were fabricated using the same procedure as in Examples 2 and 5, respectively, except that a bias of 30 to 120 V was applied. Microstructures of the deposited thin films were measured using SEM, and the results are shown in FIGS. 3b, 4b, 3d, and 4d, respectively.

EXAMPLE 10

A NCD thin film was fabricated using the same procedure as in Example 6 except that the chamber gas pressure was increased to 30 torr. Microstructure of the deposited thin film was measured using SEM, and the result is shown in FIG. 5b together with the result of Example 1 (FIG. 2a) as FIG. 5a.

EXAMPLES 11 AND 12

NCD thin films were fabricated using the same procedure as in Examples 1 and 6, respectively, except that the chamber gas pressure was increased to 50 torr. Microstructures of the deposited thin films were measured using SEM, and the results are shown in FIGS. 6a and 6b, respectively.

EXAMPLES 13 AND 14

NCD thin films were fabricated using the same procedure as in Examples 1 and 6, respectively, except that the chamber gas pressure was increased to 100 torr. Microstructures of the deposited thin films were measured using SEM, and the results are shown in FIGS. 7a and 7b, respectively.

EXAMPLE 15

Figure 8:
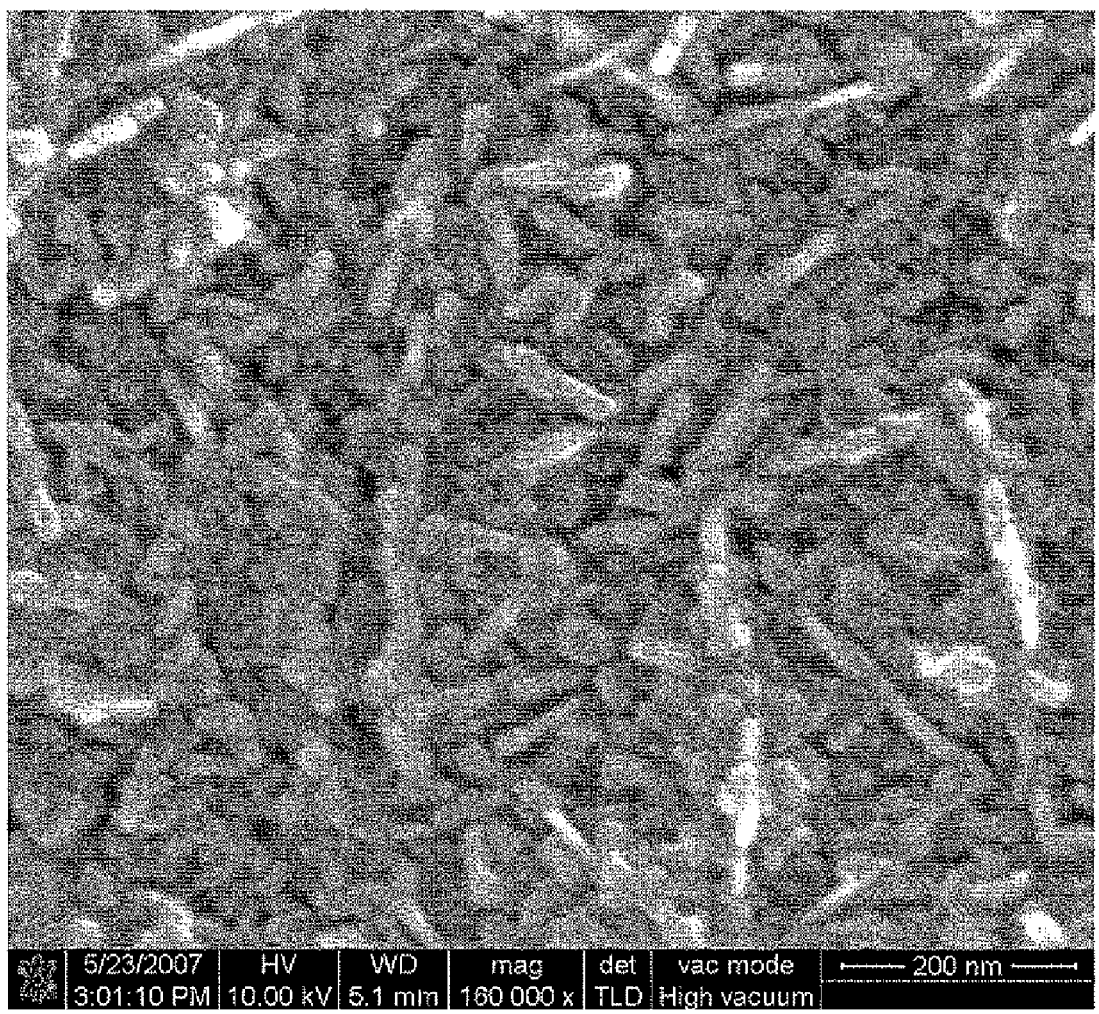
FIG. 8 illustrates a surface microstructure of a NCD thin film, which is deposited at a chamber gas pressure of 10 torr and a gas composition of 4% methane-0.3% nitrogen-95.7% hydrogen without using a substrate bias.

A NCD thin film was fabricated using the same procedure as in Example 2 except that a gas mixture of 4% methane-0.3% nitrogen-95.7% hydrogen was used as the raw material gas. A microstructure of the deposited thin film was measured using SEM, and the result is shown in FIG. 8.

EXAMPLE 16

Figure 9:
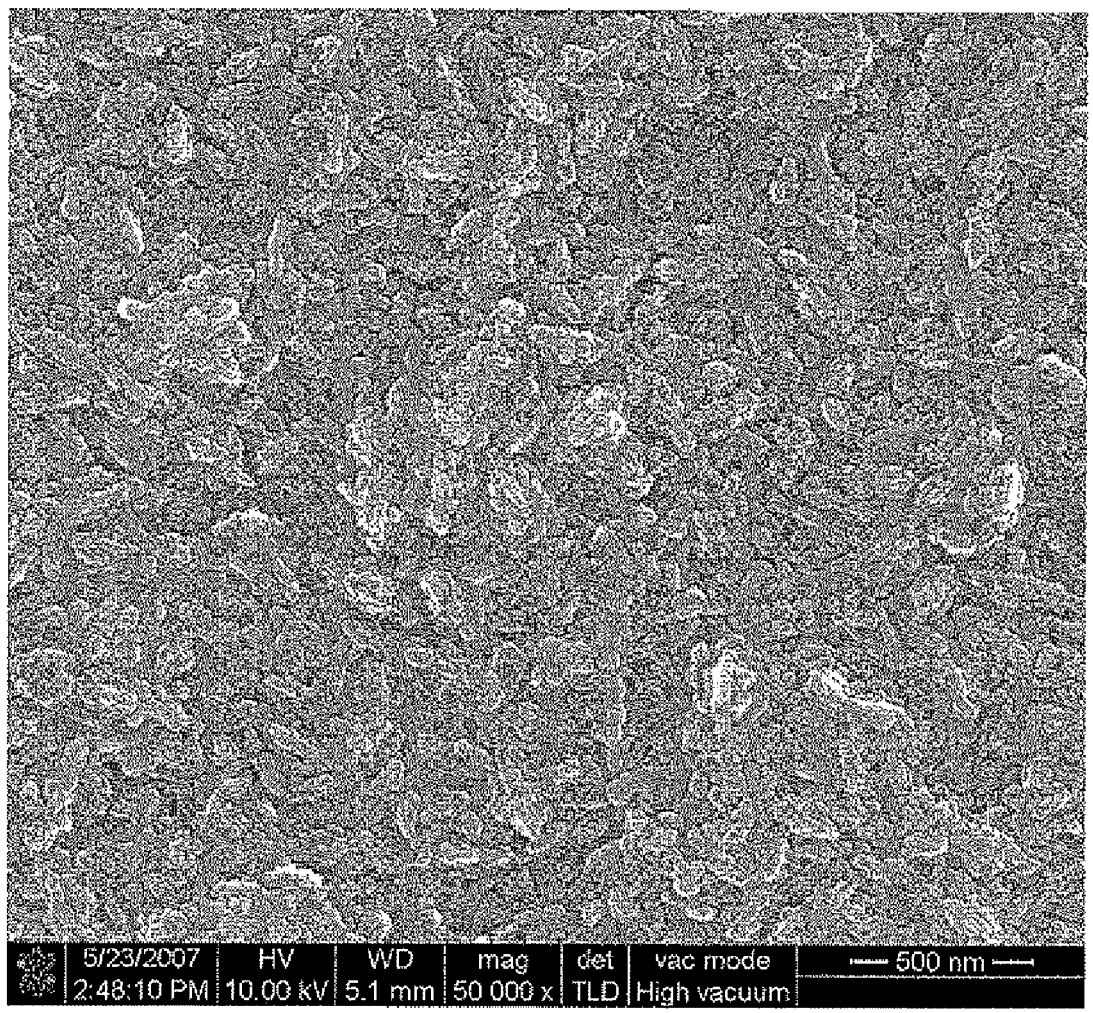
FIG. 9 illustrates a surface microstructure of a NCD thin film, which is deposited at a chamber gas pressure of 30 torr and a gas composition of 3% methane-2% nitrogen-95% hydrogen without using a substrate bias.

A NCD thin film was fabricated using the same procedure as in Example 1 except that a gas mixture of 3% methane-2% nitrogen-95% hydrogen was used as the raw material gas. A microstructure of the deposited thin film was measured using SEM, and the result is shown in FIG. 9.

In the above examples, a bias current applied to a 4-inch silicon plate so that the current is in a range of approximately 5.5 to 10, depending on a gas pressure, as illustrated in Table 1.

TABLE 1

| Current (A) | Gas pressure (torr) | Bias (V) | Hydrocarbon content (volume %) | Nitrogen content (volume %) |
|---|---|---|---|---|
| 5.5-7 | 10 | 29-39 | 5 | 0.5 |
| 6.3-7.5 |  | 39-49 | 3 | 0.3 |
| 5.3-6.9 | 15 | 30-33 | 5 | 0.5 |
| 8.5-10.7 |  | 69-80 | 3 | 0.3 |
| 8.5-9 | 30 | 89-94 | 3 | 0.3 |

TABLE 1-continued

| Current (A) | Gas pressure (torr) | Bias (V) | Hydrocarbon content (volume %) | Nitrogen content (volume %) |
|---|---|---|---|---|
| 9-10 | 50 | 110-115 | 3 | 0.3 |
| 6 | 100 | 115-120 | 3 | 0.3 |

Figure 3:
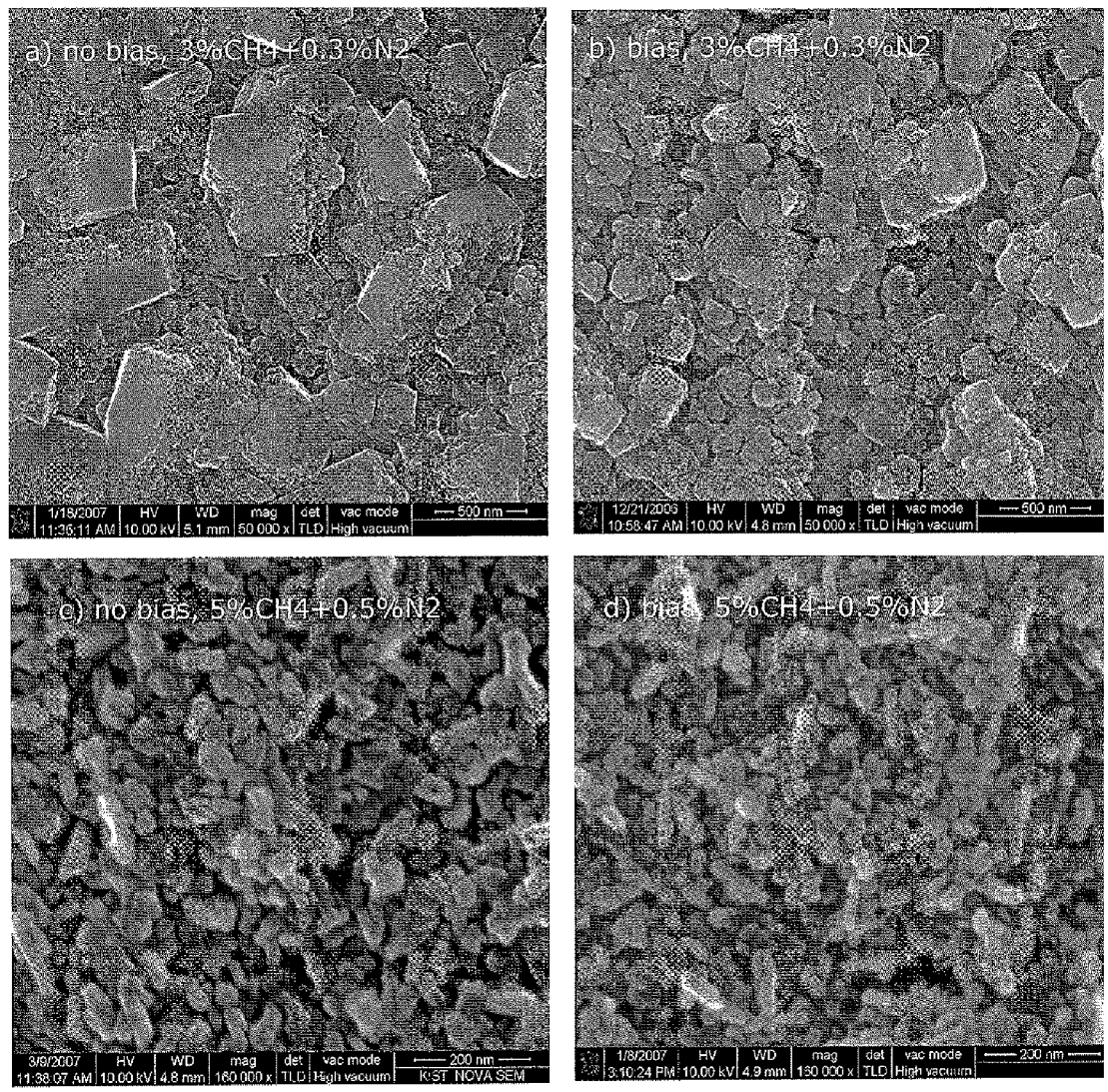
FIGS. 3 and 4 illustrate surface microstructures of a NCD thin film, which is deposited using a gas mixture of methane-nitrogen-hydrogen as a raw material gas at chamber gas pressures of 10 torr and 15 torr, respectively.
Figure 4:
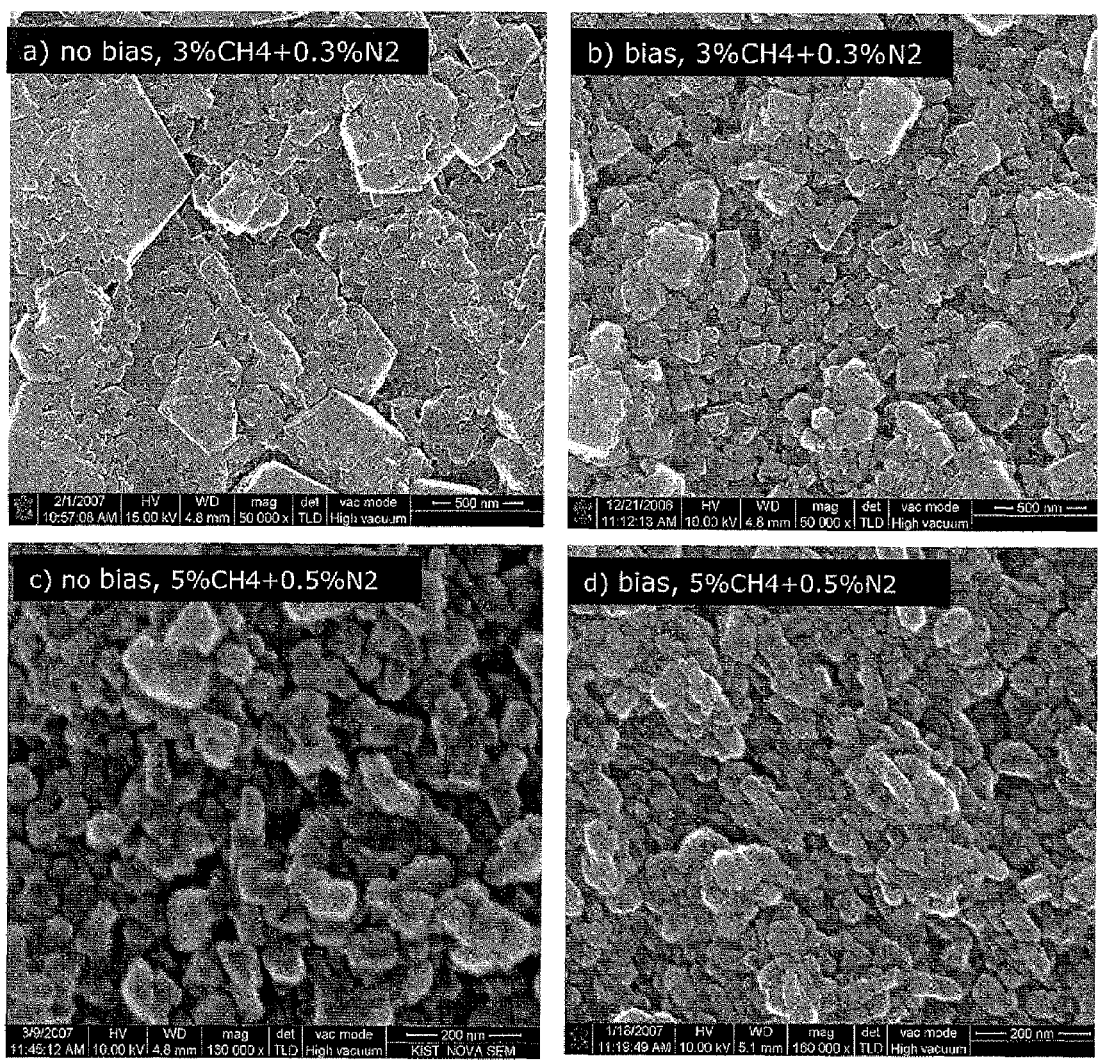

As a result, as shown in FIGS. 3 and 4, it was confirmed that when the chamber gas pressure was lowered, the inclusion of large grains increased (refer to FIGS. 3a and 4a), but at the same gas pressure when the methane content of the raw material gas was increased (refer to FIGS. 3c, 4c, and 8) or the positive bias was applied (refer to FIGS. 3b, 4b, 3d, and 4d), the inclusion of large grains decreased and grains of several tens nm in size were distributed relatively uniformly. It was also confirmed that when the chamber gas pressure was increased, the inclusion of large grains was not observed (refer to FIGS. 5a, 5b, 6a, 6b, 7a and 7b).

However, a difference between microstructures according to the nitrogen content under the conditions of the same methane content and the same chamber gas pressure was not monitored (refer to FIGS. 5a and 9).

Accordingly, it can be seen that the chamber gas pressure or the methane and nitrogen contents of the raw material gas have to be controlled or the positive bias has to be applied in order to prevent the inclusion of the large grains due to the above internal factors.

As shown above, the inventive method can prevent the inclusion of abnormal large grains, which may be caused by inappropriate process control, in depositing a NCD thin film by a hot filament CVD process.

While the invention has been shown and described with respect to the preferred embodiments, it will be understood by those skilled in the art that various changes and modifications may be made without departing from the spirit and scope of the invention as defined in the following claims.

What is claimed is:

1. A method of preventing abnormal large grains from being included into a thin nano-crystalline diamond (NCD) film which is deposited on a substrate by a hot filament chemical vapor deposition (CVD) process using a gas mixture of a hydrocarbon, nitrogen and hydrogen, which comprises:
   providing a thermally conductive, inert and elongated material to contact one end thereof to the substrate, and to contact the other end thereof to a thermocouple provided in the CVD process to measure a temperature of the substrate, the distance between the ends being greater than or equal to 50 millimeters
   wherein the thermally conductive, inert and elongated material is a diamond strip.

2. The method of claim 1, which further comprises:
   maintaining a gas pressure in a chamber for the CVD process at 10 torr or higher; controlling the hydrocarbon and nitrogen contents of the gas mixture to 0.1 to 8% by volume and 10% by volume or less, respectively.

3. The method of claim 2, wherein the gas pressure of the chamber is in the range of 30 to 100 torr and the hydrocarbon content is in the range of 3 to 5% by volume, with no bias being applied to the substrate.

4. The method of claim 2, wherein a positive bias voltage is applied to the substrate, when the gas pressure in the chamber is in the range of between 10 to 15 torr.

5. The method of claim 2, wherein the hydrocarbon is selected from the group consisting of methane, ethane and propane, and a mixture thereof.

6. The method of claim 5, wherein the hydrocarbon is methane and employed in an amount of 1 to 8% by volume.

7. The method of claim 2, wherein the gas mixture contains no oxygen.

8. The method of claim 2, wherein the positive bias voltage is applied in the range of between 20 and 150 V.

* * * * *